US009105531B2

(12) United States Patent
Tomita

(10) Patent No.: US 9,105,531 B2
(45) Date of Patent: Aug. 11, 2015

(54) SEMICONDUCTOR DEVICE

(75) Inventor: Kazuo Tomita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/395,296

(22) PCT Filed: Jul. 19, 2012

(86) PCT No.: PCT/JP2012/068282
§ 371 (c)(1),
(2), (4) Date: Oct. 17, 2014

(87) PCT Pub. No.: WO2014/013581
PCT Pub. Date: Jan. 23, 2014

(65) Prior Publication Data
US 2015/0091161 A1    Apr. 2, 2015

(51) Int. Cl.
*H01L 23/58*    (2006.01)
*H01L 23/00*    (2006.01)

(52) U.S. Cl.
CPC .............. *H01L 24/13* (2013.01); *H01L 23/562* (2013.01); *H01L 23/585* (2013.01); *H01L 2224/023* (2013.01); *H01L 2224/13024* (2013.01); *H01L 2924/01013* (2013.01)

(58) Field of Classification Search
CPC .................. H01L 2924/0002; H01L 2924/00; H01L 21/56; H01L 23/3192; H01L 23/562; H01L 23/585
See application file for complete search history.

(56) References Cited

U.S. PATENT DOCUMENTS

| 5,854,141 | A  | * | 12/1998 | Cronin et al. ................. 438/763 |
| 7,049,701 | B2 | * | 5/2006  | Usui .............................. 257/773 |
| 7,400,028 | B2 | * | 7/2008  | Tomita .......................... 257/620 |
| 7,579,696 | B2 | * | 8/2009  | Ito et al. ........................ 257/784 |
| 7,968,976 | B2 | * | 6/2011  | Chang et al. ................... 257/626 |
| 8,253,217 | B2 | * | 8/2012  | Chen et al. .................... 257/503 |
| 8,334,582 | B2 | * | 12/2012 | Jeng et al. ..................... 257/620 |
| 8,435,868 | B2 |   | 5/2013  | Shigihara et al. |
| 8,810,001 | B2 | * | 8/2014  | Hung et al. .................... 257/532 |
| 2007/0090447 | A1 | * | 4/2007 | Morimoto et al. ............ 257/316 |

(Continued)

FOREIGN PATENT DOCUMENTS

| JP | 2000-243754 A | 9/2000 |
| JP | 2000-340593 A | 12/2000 |

(Continued)

OTHER PUBLICATIONS

International Search Report for PCT/JP2012/068282 dated Aug. 14, 2012.

(Continued)

*Primary Examiner* — Stephen W Smoot
*Assistant Examiner* — Edward Chin
(74) *Attorney, Agent, or Firm* — Sughrue Mion, PLLC

(57) ABSTRACT

A first photosensitive organic insulating film (PO1) formed in contact with a passivation film (PL) covers the entire circumference of a stepped portion (TRE) at a surface of the passivation film PL formed by a topmost conductive layer (TCL) and has an outer circumferential edge (ED1) positioned, along the entire circumference, on the outer circumferential side with respect to the stepped portion (TRE). This can prevent the first photosensitive organic insulating film (PO1) from peeling off the passivation film (PL).

11 Claims, 16 Drawing Sheets

(56) References Cited

U.S. PATENT DOCUMENTS

| | | | |
|---|---|---|---|
| 2008/0001241 A1* | 1/2008 | Tuckerman et al. | 257/434 |
| 2008/0283969 A1* | 11/2008 | Jeng et al. | 257/620 |
| 2009/0008783 A1* | 1/2009 | Saigoh et al. | 257/760 |
| 2009/0115024 A1* | 5/2009 | Jeng et al. | 257/620 |
| 2010/0181650 A1* | 7/2010 | Shigihara et al. | 257/620 |
| 2010/0181681 A1* | 7/2010 | Akiba et al. | 257/773 |
| 2012/0241917 A1* | 9/2012 | Ide et al. | 257/622 |
| 2014/0027928 A1* | 1/2014 | Watanabe et al. | 257/774 |
| 2014/0239455 A1* | 8/2014 | Ishii | 257/620 |

FOREIGN PATENT DOCUMENTS

| | | |
|---|---|---|
| JP | 2006-173476 A | 6/2006 |
| JP | 2009-88001 A | 4/2009 |
| JP | 2010-192867 A | 9/2010 |
| JP | 2011-14605 A | 1/2011 |

OTHER PUBLICATIONS

Communication dated Apr. 21, 2015 from the Japanese Patent Office in counterpart application No. 2014-525613.

* cited by examiner

SEMICONDUCTOR DEVICE

TECHNICAL FIELD

The present invention relates to a semiconductor device, and for example, to a semiconductor device having an element forming region and a guard ring region surrounding the element forming region in a plan view.

BACKGROUND ART

A chip structure for bare chip/flip chip mounting is known in which elements (a redistribution layer and a bump electrode) necessary for packaging on a wafer level. Such a chip structure is described in, for example, Japanese Patent Laying-Open Nos. 2000-243754 (PTD 1), 2010-192867 (PTD 2) and the like.

In the chip structure described in each of the above-described two publications, a passivation film is formed on a conductive layer to be an electrode pad, and an organic insulating film, a redistribution layer, a bump electrode, and the like are formed on that passivation film.

CITATION LIST

Patent Document

PTD 1: Japanese Patent Laying-Open No. 2000-243754
PTD 2: Japanese Patent Laying-Open No. 2010-192867

SUMMARY OF INVENTION

Technical Problem

In the conventional chip structure, however, adhesion between the passivation film and the organic insulating film formed on that passivation film is poor, and the organic insulating film is likely to peel off the passivation film.

Other subjects and novel characteristics will become apparent from the description of the present specification and the accompanying drawings.

Solution to Problem

According to one embodiment, a first photosensitive organic insulating film formed in contact with a passivation film covers the entire circumference of a stepped portion at a surface of the passivation film formed by the topmost conductive layer and has an outer circumferential edge positioned, along the entire circumference, on the outer circumferential side with respect to the stepped portion.

Advantageous Effects of Invention

According to the one embodiment, the first photosensitive organic insulating film can be prevented from peeling off the passivation film.

DESCRIPTION OF EMBODIMENTS

Hereinafter, embodiments will be described based on the drawings.

First Embodiment

Figure 1:
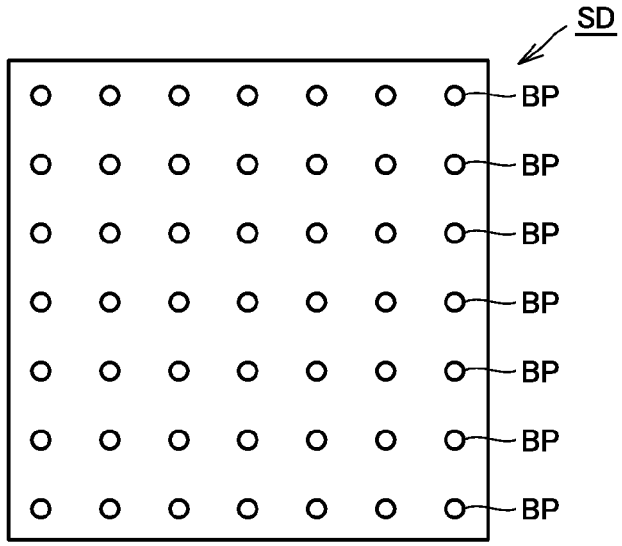
FIG. 1 is a plan view schematically showing a structure of a semiconductor device in a chip state according to a first embodiment.

Referring to FIG. 1, a semiconductor device SD in a chip state according to the present embodiment has a plurality of bump electrodes BP on its surface.

Figure 2:
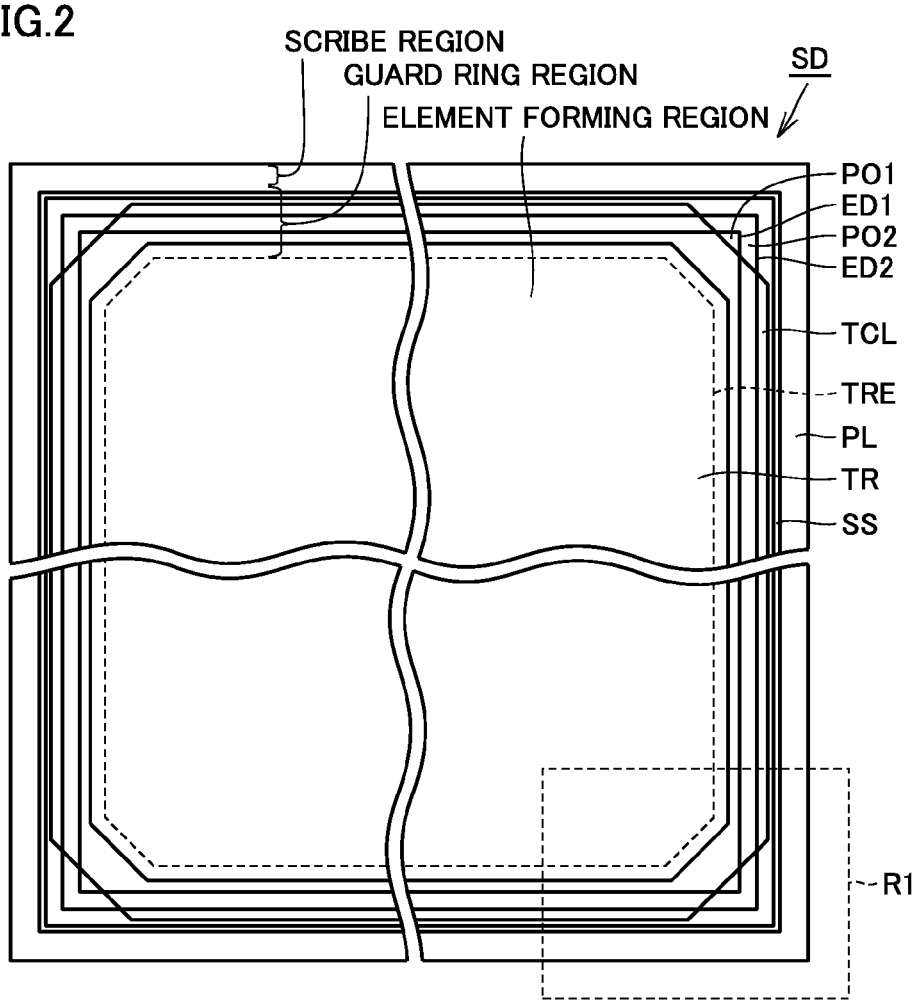
FIG. 2 is an enlarged plan view showing the semiconductor device in the chip state shown in FIG. 1.
Figure 3:
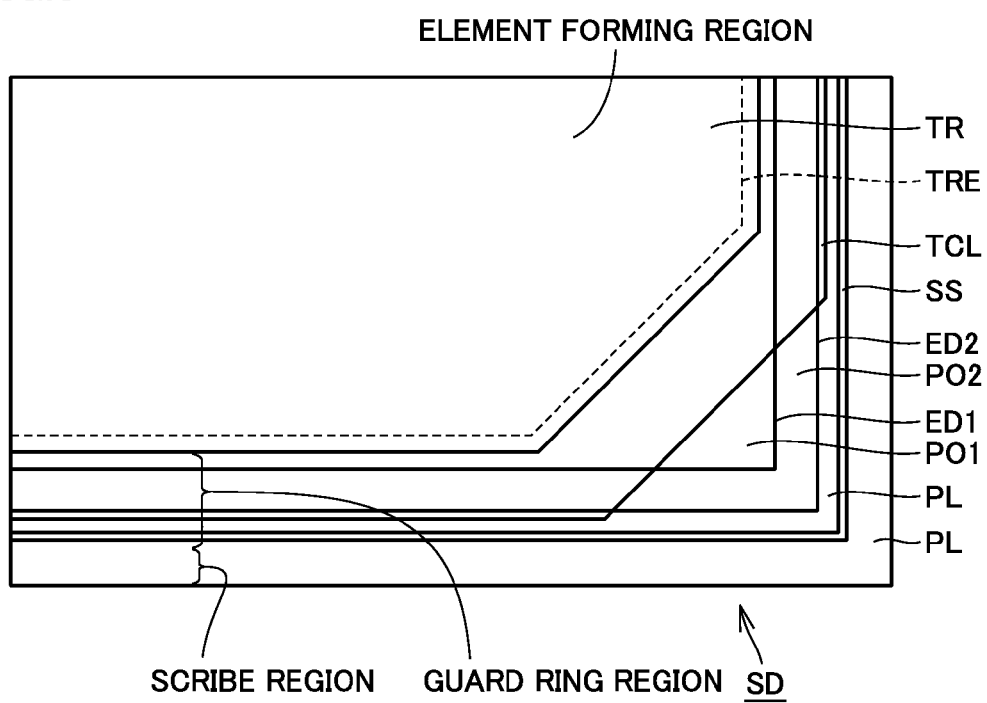
FIG. 3 is an enlarged partial plan view showing a region R1 in FIG. 2.

Referring to FIGS. 2 and 3, an element forming region is located in an inner circumferential region of the surface of semiconductor device SD in a plan view (as seen in a direction orthogonal to the surface of a semiconductor substrate SB (FIGS. 4 and 5)), and a scribe region is located in an outermost circumferential region. Between the element forming region and the scribe region, a guard ring region is located to surround the entire circumference of the element forming region.

On the outermost circumferential side of the guard ring region, a silane slit SS is located to surround the entire circumference of the guard ring. It is noted that above-described plurality of bump electrodes BP are located in the element forming region.

Figure 4:
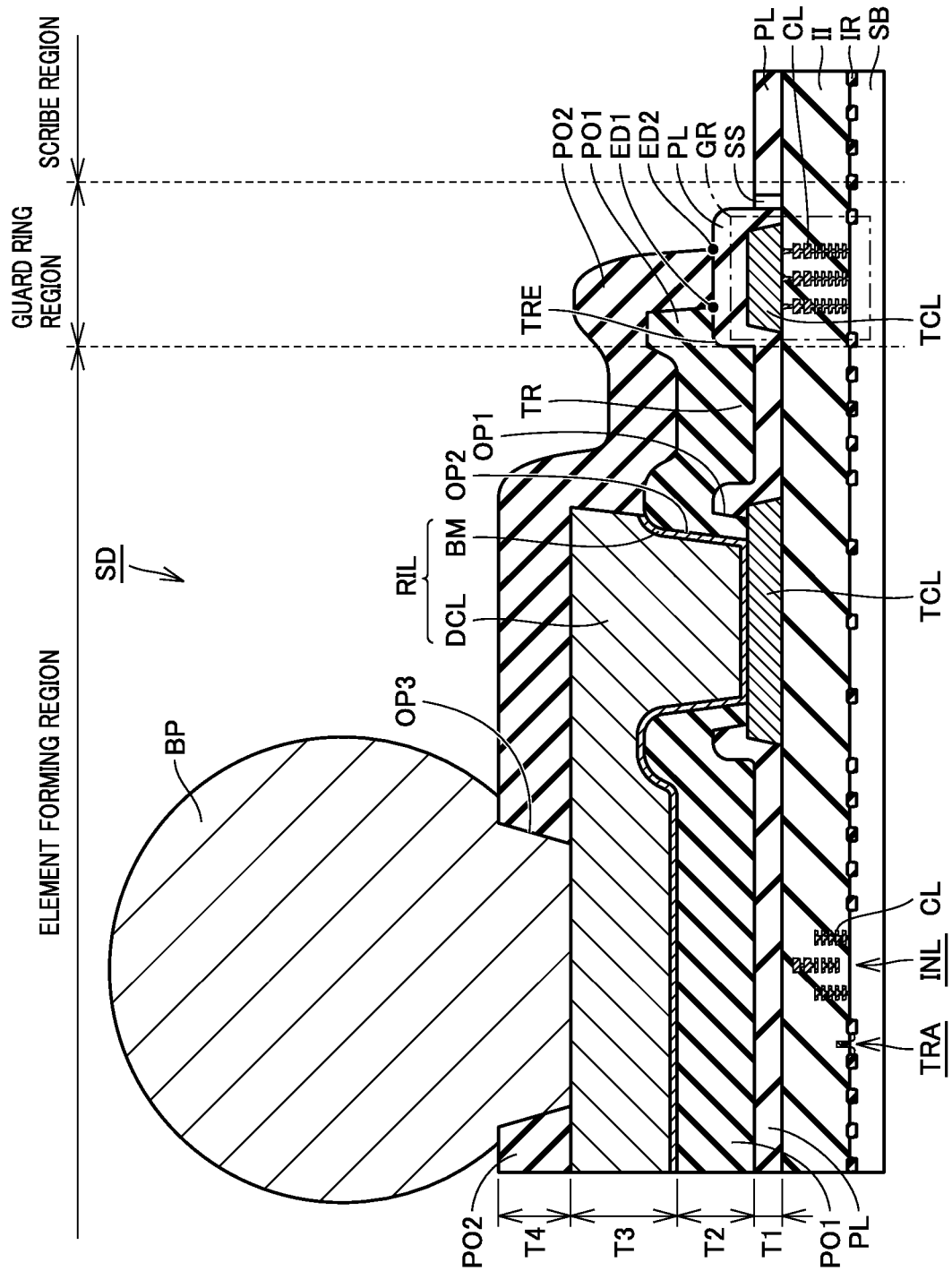
FIG. 4 is an enlarged partial cross sectional view schematically showing the outer circumferential edge of the semiconductor device in the chip state shown in FIG. 1 and its neighborhood.
Figure 5:
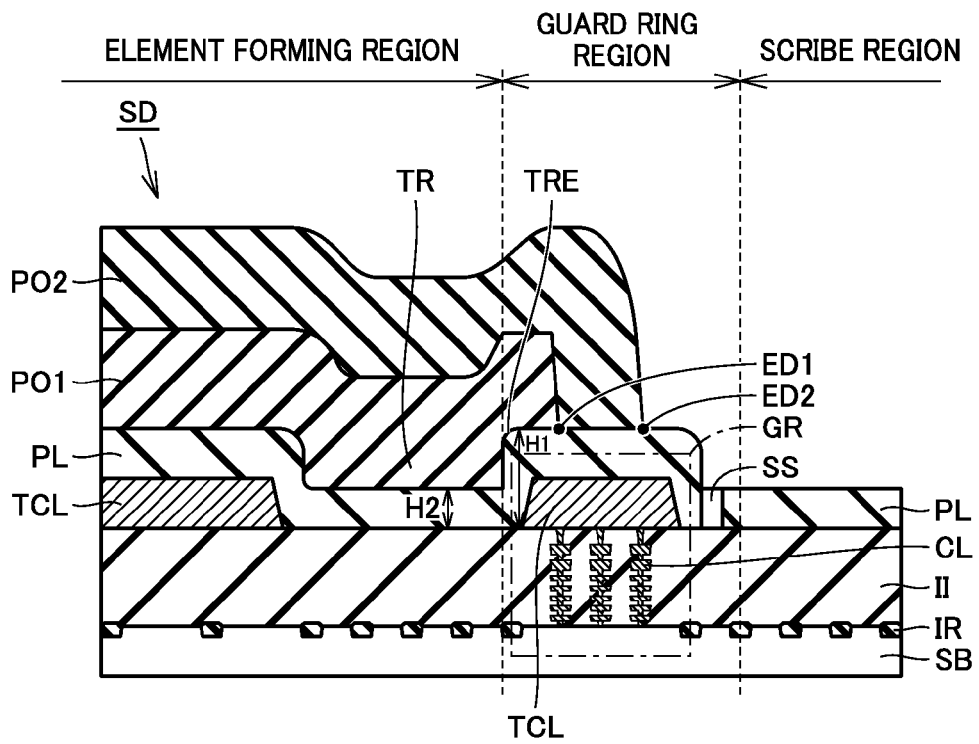
FIG. 5 is a further enlarged partial cross sectional view schematically showing the outer circumferential edge and its neighborhood in FIG. 4.

Referring to FIGS. 4 and 5, an element isolation structure IR made of a STI (Shallow Trench Isolation) or LOCOS (Local Oxidation of Silicon) oxide film, for example, is formed on the surface of semiconductor substrate SB made of silicon, for example. Elements such as a MOS (Metal Oxide Semiconductor) transistor TRA are formed within the element forming region on the surface of semiconductor substrate SB electrically isolated by this element isolation structure IR.

On the surface of this semiconductor substrate SB, each of multiple conductive layers CL and each of multiple interlayer insulating layers II are alternately laminated. Each of these multiple conductive layers CL is made of a material containing Cu (copper), for example, and has a damascene structure. Each of multiple interlayer insulating layers II is made of, for example, a silicon oxide film, a lower dielectric constant (Low-k) material, or the like.

In the element forming region, various elements formed by conductive layers CL, a multilayer interconnect structure INL and the like are formed. In the guard ring region, part of guard ring GR is formed by multiple conductive layers CL. Each of multiple conductive layers CL constituting this guard ring GR is formed to surround the entire circumference of the element forming region in a plan view. It is noted that the surface of each of multiple interlayer insulating layers II has been planarized to be a relatively flat surface.

On topmost interlayer insulating layer II among multiple interlayer insulating layers II, a topmost conductive layer TCL made of a material containing Al (aluminum) or Cu, for example. This topmost conductive layer TCL has a topmost conductive layer TCL for pad and a topmost conductive layer TCL for guard ring.

Topmost conductive layer TCL for pad is formed in the element forming region and has a portion (pad portion) functioning as a pad electrode. Topmost conductive layer TCL for guard ring is formed in the guard ring region, and constitutes part of guard ring GR. Topmost conductive layer TCL for pad and topmost conductive layer TCL for guard ring are layers formed from a same layer to be isolated from each other.

Guard ring GR is formed by multiple conductive layers CL and topmost conductive layer TCL for guard ring. This guard ring GR is mainly intended to prevent moisture from entering the element forming region, and preferably extends from the surface of semiconductor substrate SB onto topmost interlayer insulating layer II. Topmost conductive layer TCL for guard ring is formed to surround the entire circumference of the element forming region in a plan view as shown in FIG. 2.

Referring to FIGS. 4 and 5, a passivation film PL is formed on topmost interlayer insulating layer II to cover topmost conductive layer TCL for pad and topmost conductive layer TCL for guard ring. This passivation film PL is formed in each of the element forming region, the guard ring region and the scribe region. Passivation film PL is made of a material having moisture resistance, and is made of, for example, a single insulating layer containing nitrogen or laminated films including an insulating layer containing nitrogen. Specifically, passivation film PL is made of p-SiN (plasma silicon nitride film), p-SiON (plasma silicon oxynitride film), p-SiN/p-SiO$_2$ (plasma silicon nitride film/plasma silicon oxide film), p-SiON/p-SiO$_2$ (plasma silicon oxynitride film/plasma silicon oxide film), or the like.

In the element forming region, passivation film PL on topmost conductive layer TCL for pad has formed therein an opening OP1 reaching the surface of topmost conductive layer TCL for pad. Because of this opening OP1, part of the surface of topmost conductive layer TCL for pad is uncovered by passivation film PL.

In the vicinity of the boundary between the element forming region and the guard ring region, a stepped portion TRE is formed at the surface of passivation film PL. This stepped portion TRE is positioned on the inner circumferential side which is to be the element forming region side with respect to topmost conductive layer TCL for guard ring.

Because of this stepped portion TRE, the surface of passivation film PL on the inner circumferential side with respect to topmost conductive layer TCL for guard ring is lower than the surface of passivation film PL directly over topmost conductive layer TCL for guard ring. That is, as seen from the surface of topmost interlayer insulating layer II as shown in FIG. 5, a height H2 of the surface of passivation film PL on the inner circumferential side with respect to topmost conductive layer TCL for guard ring is lower than a height H1 of the surface of passivation film PL directly over a topmost conductive layer TCL for guard ring.

In a region where topmost conductive layer TCL for pad is positioned on the inner circumferential side of topmost conductive layer TCL for guard ring, a trench TR will be formed in the surface of passivation film PL between topmost conductive layer TCL for guard ring and topmost conductive layer TCL for pad. This trench TR has a width (a size in a direction from the inner circumferential side to the outer circumferential side of semiconductor device SD) of 5 µm, for example, and may range from 0.5 µm to 50 µm.

A silane slit SS is formed on the outermost circumferential side of the guard ring region. This silane slit SS is implemented by a trench extending through passivation film PL to reach topmost interlayer insulating layer II. Silane slit SS is formed to surround the entire circumference of guard ring GR in the plan view shown in FIG. 2. Silane slit SS is intended to prevent a crack running through passivation film PL from extending into guard ring GR and into the element forming region when isolating a semiconductor wafer into semiconductor chips by dicing.

Referring to FIGS. 4 and 5, a first photosensitive organic insulating film PO1 is formed on passivation film PL to directly contact the surface of this passivation film PL. This first photosensitive organic insulating film PO1 is made of polyimide, for example. First photosensitive organic insulating film PO1 covers trench TR and the entire circumference of stepped portion TRE in the plan view shown in FIG. 2 and has an outer circumferential edge ED1 positioned, along the entire circumference, on the outer circumferential side with respect to stepped portion TRE.

Referring to FIGS. 4 and 5, first photosensitive organic insulating film PO1 has formed therein an opening OP2 reaching the surface of topmost conductive layer TCL for pad. This opening OP2 is formed to extend within opening OP1. Because of opening OP2, part of the surface of topmost conductive layer TCL for pad is uncovered by first photosensitive organic insulating film PO1.

A redistribution layer RIL is formed on first photosensitive organic insulating film PO1. This redistribution layer RIL is connected to a pad portion of topmost conductive layer TCL for pad through opening OP2. Redistribution layer RIL is formed to extend from a directly overlying region of the pad portion of topmost conductive layer TCL for pad to an other region different from the directly overlying region.

This redistribution layer RIL has a barrier metal layer BM formed in contact with the surface of first photosensitive organic insulating film PO1 and a conductive layer DCL formed on barrier metal layer BM. Barrier metal layer BM is made of, for example, a material containing one kind of Cr (chromium), Ti (titanium), TiN (titanium nitride), Ta (tantalum), W (tungsten), and Mo (molybdenum) or any combination thereof. Conductive layer DCL is made of a material containing Cu, for example.

A second photosensitive organic insulating film PO2 is formed over first photosensitive organic insulating film PO1 to cover redistribution layer RIL. This second photosensitive organic insulating film PO2 is made of polyimide, for example. Second photosensitive organic insulating film PO2 covers the entire circumference of outer circumferential edge ED1 of first photosensitive organic insulating film PO1 as shown in FIG. 2. This second photosensitive organic insulating film PO2 has an outer circumferential edge ED2 positioned along its entire circumference on the outer circumferential side with respect to outer circumferential edge ED1 of first photosensitive organic insulating film PO1. Outer circumferential edge ED1 of first photosensitive organic insulating film PO1 and outer circumferential edge ED2 of second photosensitive organic insulating film PO2 are both positioned directly over topmost conductive layer TCL for guard ring.

Referring to FIG. 4, second photosensitive organic insulating film PO2 has formed therein an opening OP3 reaching the surface of redistribution layer RIL. Because of this opening OP3, part of the surface of redistribution layer RIL is uncovered by second photosensitive organic insulating film PO2.

On second photosensitive organic insulating film PO2, a bump electrode BP is formed to be connected to redistribution layer RIL through opening OP3. Bump electrode BP is electrically connected to topmost conductive layer TCL for pad through redistribution layer RIL. Bump electrode BP is positioned directly over the other region different from the directly overlying region of the pad portion of topmost conductive layer TCL for pad. Bump electrode BP has an alloy composition of Sn (tin)-xAg (silver)-0.5Cu, for example.

In the above-described structure, topmost conductive layer TCL has a thickness of 1 µm, for example, and may range from 0.5 µm to 5 µm. Passivation film PL has a thickness T1 of less than or equal to 1 µm, for example. First photosensitive organic insulating film PO1 has a thickness T2 of 5 µm, for example. Redistribution layer RIL has a thickness T3 of 10 µm, for example. Second photosensitive organic insulating film PO2 has a thickness T4 of 5 µm, for example.

The semiconductor device of the present embodiment is a 90-nm logic product, for example. In this product, the line and space (L/S) of lowermost conductive layer CL among multiple conductive layers CL is 130 nm/130 nm, for example, while the line and space (L/S) of second to fifth conductive layers CL from the bottom among multiple conductive layers CL is 140 nm/140 nm, for example. The line and space (L/S) of sixth and seventh conductive layers CL (semiglobal wiring) from the bottom among multiple conductive layers CL is 280 nm/280 nm, for example. Topmost conductive layer TCL has a line width (L) of 2 µm, for example.

The case where the material of first and second photosensitive organic insulating films PO1 and PO2 are both made of polyimide has been described above, however, they may be other photosensitive organic insulating films. First and second photosensitive organic insulating films PO1 and PO2 may be made of an identical material or may be made of different materials from each other.

Figure 22:
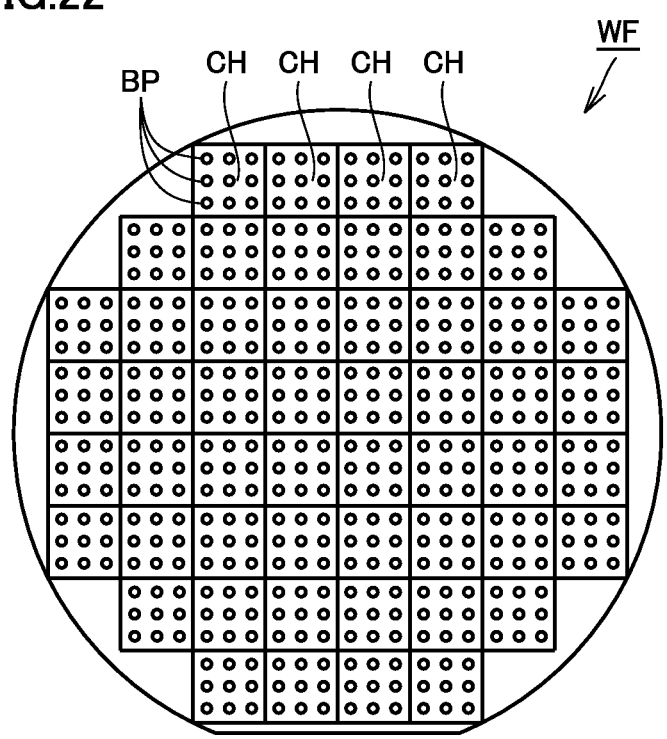
FIG. 22 is a plan view schematically showing a structure of a semiconductor device in a wafer state.

It is noted that semiconductor device SD in the chip state shown in FIG. 1 is obtained by cutting a semiconductor device WF in the wafer state shown in FIG. 22. Semiconductor device WF in the wafer state shown in FIG. 22 has a plurality of chip regions CH (regions each including the element forming region and the guard ring region) arranged in a matrix and a scribe region positioned between chip regions CH. This semiconductor device WF in the wafer state is divided by dicing at the scribe region into semiconductor device SD in the chip state shown in FIG. 1.

This semiconductor device WF in the wafer state has passivation film PL, first and second photosensitive organic insulating films PO1 and PO2 formed on passivation film PL, redistribution layer RIL, as well as bump electrode BP, as shown in FIG. 4.

In FIG. 22, the number of bump electrodes BP shown in one chip region CH is nine, which differs from the number of bump electrodes BP in semiconductor device SD in one chip state shown in FIG. 1. The illustration is, however, merely made in accordance with the scale of drawings, and actually there is no difference in the number.

Next, a manufacturing method of the present embodiment will be described with reference to FIGS. 6 to 10.

Figure 6:
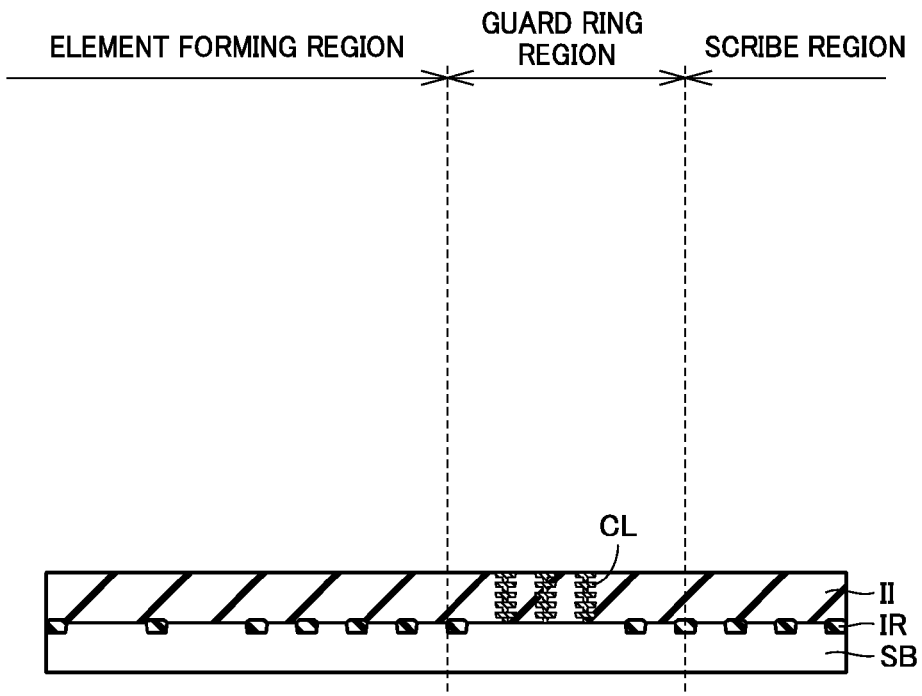
FIG. 6 is a schematic cross sectional view showing a first step of a method for manufacturing the semiconductor device according to the first embodiment in correspondence with the cross section shown in FIG. 5.
Figure 7:
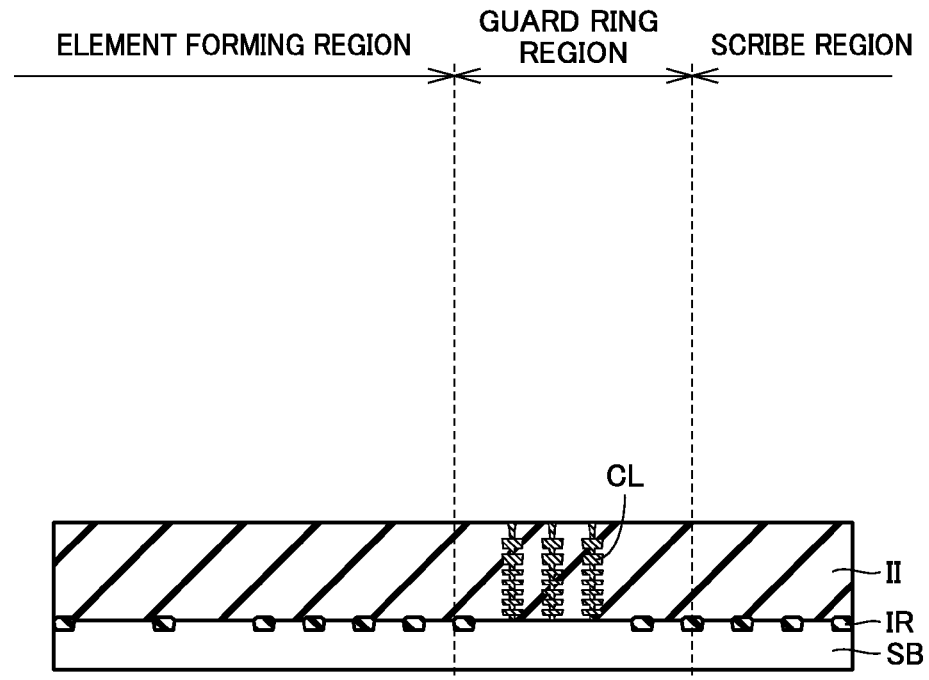
FIG. 7 is a schematic cross sectional view showing a second step of the method for manufacturing the semiconductor device according to the first embodiment in correspondence with the cross section shown in FIG. 5.

Referring to FIGS. 6 and 7, semiconductor substrate SB in the wafer state made of silicon, for example, is prepared. An element isolation structure IR made of a STI or LOCOS oxide film, for example, is formed in the surface of this semiconductor substrate SB. Elements such as a MOS transistor (not shown) are formed on the surface of semiconductor substrate SB electrically isolated by this element isolation structure IR.

Thereafter, each of multiple interlayer insulating layers II and each of multiple conductive layers CL are laminated alternately on the surface of semiconductor substrate SB. On this occasion, upper and lower conductive layers CL may be electrically connected to each other with a plug made of W, for example. Lowermost conductive layer CL may be formed by a single damascene flow of Cu, for example, and second and subsequent conductive layers CL from the bottom may be formed by a dual damascene flow of Cu, for example.

Figure 8:
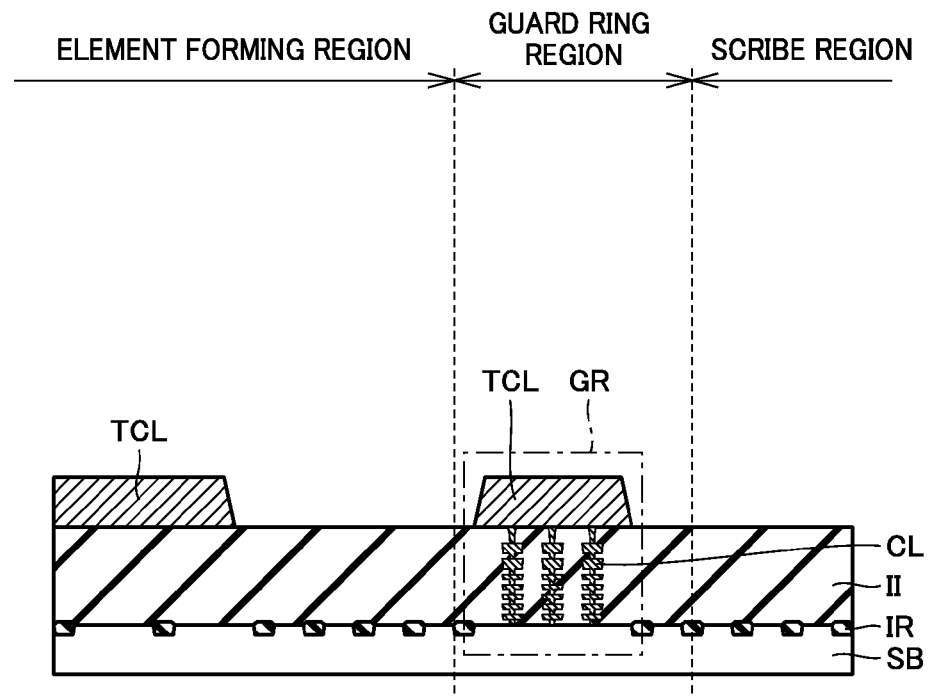
FIG. 8 is a schematic cross sectional view showing a third step of the method for manufacturing the semiconductor device according to the first embodiment in correspondence with the cross section shown in FIG. 5.

Referring to FIG. 8, topmost conductive layer TCL made of Al having a thickness of 1 µm, for example, is formed on topmost interlayer insulating layer II. This topmost conductive layer TCL is patterned by a photolithography technique and etching technique, for example. Accordingly, topmost conductive layer TCL for guard ring in the guard ring region and topmost conductive layer TCL for pad in the element forming region are formed from a same topmost conductive layer TCL to be isolated from each other.

Guard ring GR is formed by this topmost conductive layer TCL for guard ring and multiple conductive layers CL. It is noted that topmost conductive layer TCL for guard ring and topmost conductive layer CL among multiple conductive layers CL are connected with a plug made of W, for example. Multiple conductive layers CL and topmost conductive layer TCL for guard ring constituting this guard ring GR are each formed to surround the entire circumference of the element forming region in a plan view.

Figure 9:
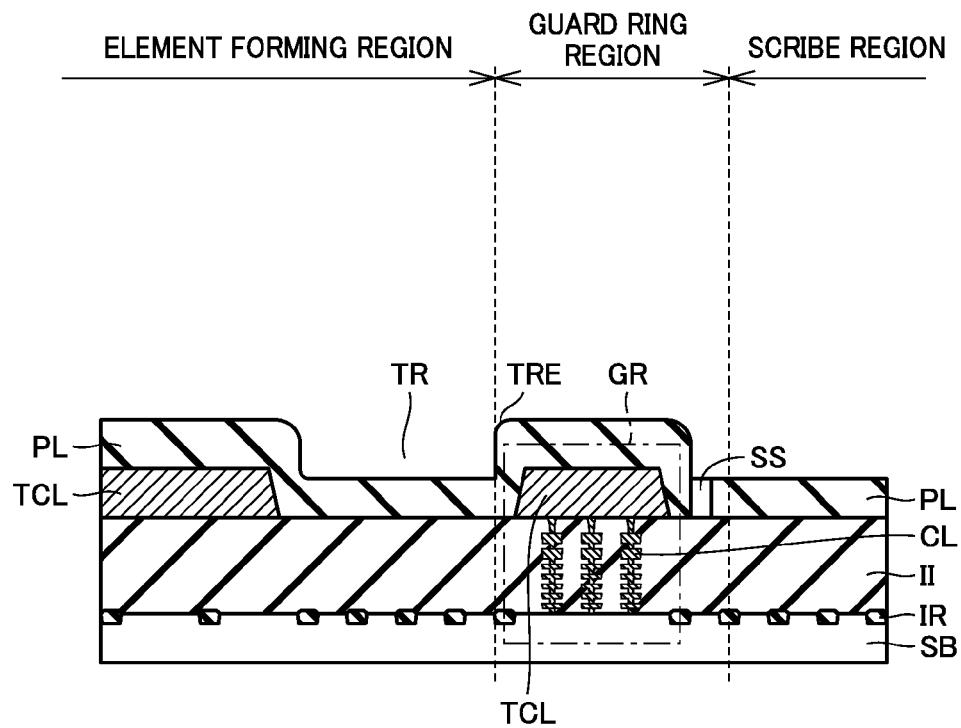
FIG. 9 is a schematic cross sectional view showing a fourth step of the method for manufacturing the semiconductor device according to the first embodiment in correspondence with the cross section shown in FIG. 5.

Referring to FIG. 9, passivation film PL is formed on topmost interlayer insulating layer II to cover topmost conductive layer TCL for guard ring, topmost conductive layer TCL for pad and the like. This passivation film PL is formed by p-SiN having a thickness of 600 nm, for example.

At the surface of passivation film PL, stepped portion TRE is formed on the inner circumferential side to be the element forming region side with respect to topmost conductive layer TCL for guard ring. This stepped portion TRE is formed along the contour of topmost conductive layer TCL for guard ring, and is positioned in the vicinity of the boundary between the element forming region and the guard ring region. Stepped portion TRE is formed to surround the entire circumference of the element forming region in a plan view.

Because of this stepped portion TRE, the surface of passivation film PL on the inner circumferential side with respect to topmost conductive layer TCL for guard ring is lower than the surface of passivation film PL directly over topmost conductive layer TCL for guard ring.

In a region where topmost conductive layer TCL for pad is positioned on the inner circumferential side of topmost conductive layer TCL for guard ring, trench TR will be formed in the surface of passivation film PL between topmost conductive layer TCL for guard ring and topmost conductive layer TCL for pad. This trench TR has a width of less than or equal to 5 µm, for example.

Thereafter, silane slit SS, an opening (not shown) reaching topmost conductive layer TCL for pad and the like are formed in passivation film PL by a typical photolithography technique and etching technique. This silane slit SS has a width of 2 µm, for example, and is formed to surround the entire circumference of guard ring GR in a plan view on the outermost circumferential side of the guard ring region.

Figure 10:
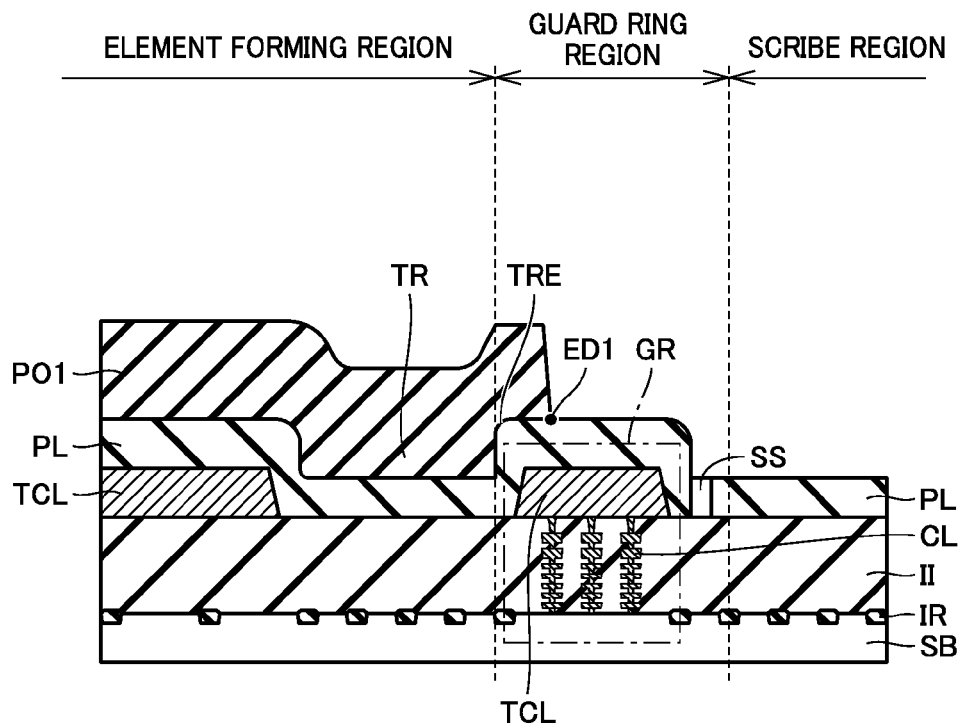
FIG. 10 is a schematic cross sectional view showing a fifth step of the method for manufacturing the semiconductor device according to the first embodiment in correspondence with the cross section shown in FIG. 5.

Referring to FIG. 10, first photosensitive organic insulating film PO1 made of polyimide, for example, is applied to be in direct contact with the surface of passivation film PL, and then exposed and developed by a photolithography technique for patterning. Accordingly, first photosensitive organic insulating film PO1 is formed to cover trench TR and the entire circumference of stepped portion TRE in the plan view shown in FIG. 2 and to have outer circumferential edge ED1 positioned, along the entire circumference, on the outer circumferential side with respect to stepped portion TRE. An opening (not shown) reaching the surface of topmost conductive layer TCL for pad is formed in first photosensitive organic insulating film PO1. It is noted that first photosensitive organic insulating film PO1 has a thickness of 5 µm, for example.

Referring to FIGS. 4 and 5, redistribution layer RIL is formed on first photosensitive organic insulating film PO1. Thereafter, second photosensitive organic insulating film PO2 made of polyimide, for example, is applied to first photosensitive organic insulating film PO1 to cover redistribution layer RIL, and then exposed and developed by a photolithography technique for patterning. This second photosensitive organic insulating film PO2 has a thickness of 5 µm, for example.

Second photosensitive organic insulating film PO2 is formed to cover the entire circumference of outer circumferential edge ED1 of first photosensitive organic insulating film PO1 and formed such that outer circumferential edge ED2 of second photosensitive organic insulating film PO2 is positioned on the outer circumferential side with respect to outer circumferential edge ED1 of first photosensitive organic insulating film PO1. An opening OP3 reaching redistribution layer RIL is formed in second photosensitive organic insulating film PO2.

Thereafter, bump electrode BP is formed on second photosensitive organic insulating film PO2 to be connected to redistribution layer RIL through opening OP3. This bump electrode BP has an alloy composition of Sn-xAg-0.5Cu, for example.

From the foregoing, semiconductor device WF in the wafer state having bump electrode BP shown in FIG. 22 is formed. Thereafter, semiconductor device WF in the wafer state is divided by dicing at the scribe region to form semiconductor device SD in the chip state shown in FIG. 1.

Next, functions and effects of the present embodiment will be described in comparison with a structure shown in FIGS. 11 to 13.

Figure 11:
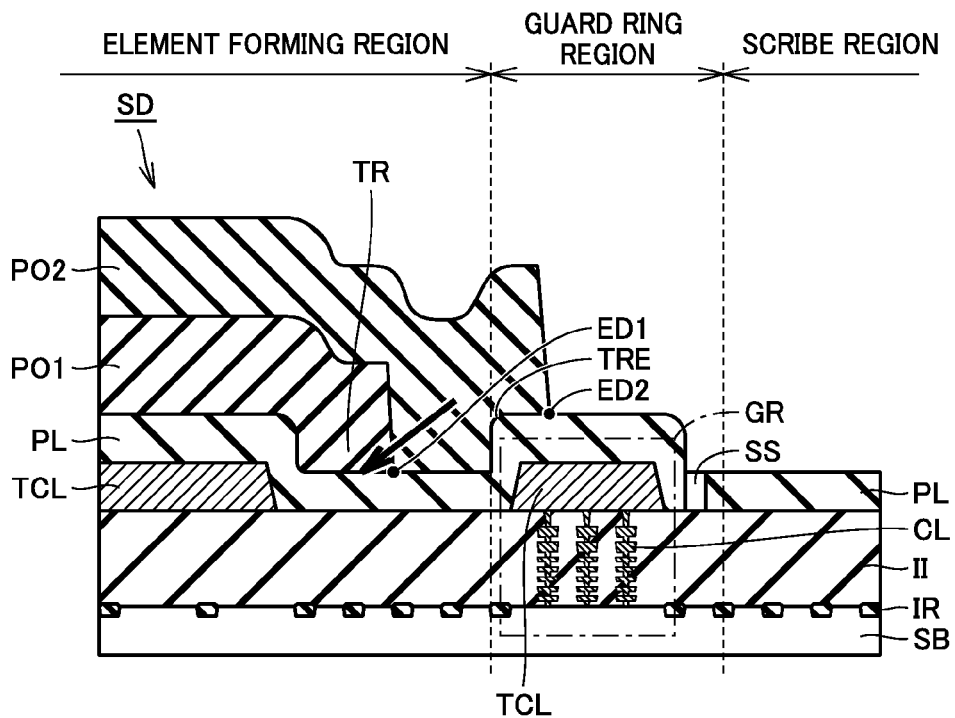
FIG. 11 is a cross-sectional view schematically showing a structure of a semiconductor device of related art.

Referring to FIG. 11, in this structure, the position of outer circumferential edge ED1 of first photosensitive organic insulating film PO1 is different from the structure of the present embodiment shown in FIGS. 4 and 5. Specifically, in the structure shown in FIG. 11, outer circumferential edge ED1 of first photosensitive organic insulating film PO1 is positioned in a recess (trench TR) positioned on the inner circumferential side with respect to topmost conductive layer TCL for guard ring. That is, outer circumferential edge ED1 of first photosensitive organic insulating film PO1 is positioned on the inner circumferential side of stepped portion TRE.

It is noted that since the remaining structure of FIG. 11 is substantially the same as the structure of the above-described present embodiment, the same elements are denoted by the same reference characters, and description thereof will not be repeated.

In this structure of FIG. 11, first photosensitive organic insulating film PO1 is likely to peel off passivation film PL. The reason is considered as follows.

Figure 12:
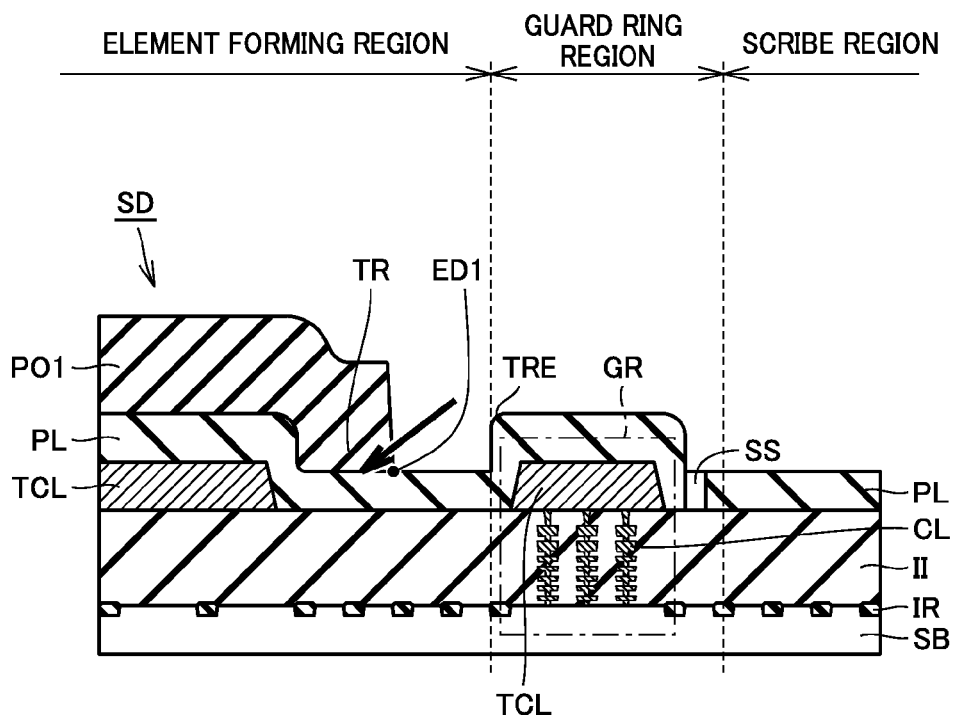
FIG. 12 is a schematic cross sectional view showing a step of developing a first photosensitive organic insulating film in a method for manufacturing the semiconductor device of related art.

Referring to FIG. 12, a developing solution used in developing first photosensitive organic insulating film PO1 is removed after the end of development. Removal of this developing solution is accomplished by scattering the developing solution to the outer circumferential side by centrifugal force associated with rotation when rotating the wafer. If outer circumferential edge ED1 of first photosensitive organic insulating film PO1 is positioned in the recess (trench TR) on the inner circumferential side of stepped portion TRE, however, stepped portion TRE prevents the developing solution from scattering to the outer circumferential side. The developing solution thus remains in the recess (trench TR) between outer circumferential edge ED1 of first photosensitive organic insulating film PO1 and stepped portion TRE.

The developing solution remaining in this recess (trench TR) enters the interface between passivation film PL and first photosensitive organic insulating film PO1 as indicated by an arrow in the drawing to reduce adhesion between passivation film PL and first photosensitive organic insulating film PO1. This is because first photosensitive organic insulating film PO1 is likely to peel off passivation film PL.

Figure 13:
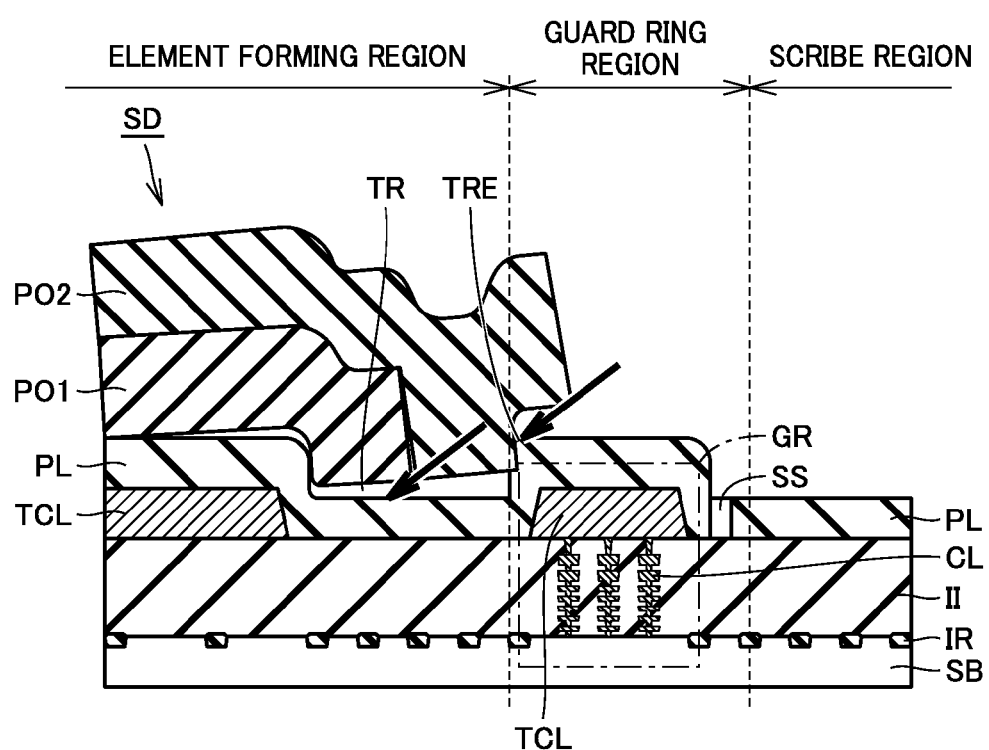
FIG. 13 is a schematic cross sectional view showing a manner in which first and second photosensitive organic insulating films have been peeled off in the method for manufacturing the semiconductor device of related art.

Referring now to FIG. 13, after second photosensitive organic insulating film PO2 and the like are formed, a tape is applied to second photosensitive organic insulating film PO2 for polishing of the rear surface of semiconductor substrate SB. It is supposed that when removing this tape, first and second photosensitive organic insulating films PO1 and PO2 peel off passivation film PL because adhesion between passivation film PL and first photosensitive organic insulating film PO1 has been reduced by the developing solution.

In contrast, in the present embodiment, first photosensitive organic insulating film PO1 covers trench TR and the entire circumference of stepped portion TRE in the plan view shown in FIG. 2 and has outer circumferential edge ED1 positioned, along the entire circumference, on the outer circumferential side with respect to stepped portion TRE. Therefore, the developing solution will not remain in the recess (trench TR) on the inner circumferential side of stepped portion TRE. Consequently, adhesion between passivation film PL and first photosensitive organic insulating film PO1 will not be reduced by the developing solution. Therefore, first photosensitive organic insulating film PO1 can be prevented from peeling off passivation film PL.

In the present embodiment, since second photosensitive organic insulating film PO2 is formed over first photosensitive organic insulating film PO1, redistribution layer RIL can be protected by second photosensitive organic insulating film PO2.

In the present embodiment, second photosensitive organic insulating film PO2 covers outer circumferential edge ED1 of first photosensitive organic insulating film PO1, and outer circumferential edge ED2 of second photosensitive organic insulating film PO2 is positioned on the outer circumferential side with respect to outer circumferential edge ED1 of first photosensitive organic insulating film PO1. A stepped portion such as stepped portion TRE does not exist on the outer circumference of outer circumferential edge ED2 of second photosensitive organic insulating film PO2. Accordingly, the developing solution will not remain in the vicinity of outer circumferential edge ED2 of second photosensitive organic insulating film PO2. Consequently, adhesion between second photosensitive organic insulating film PO2 and passivation film PL will not be reduced by the developing solution.

In the present embodiment, bump electrode BP is positioned directly over the other region different from the directly overlying region of topmost conductive layer TCL for pad. This increases flexibility in arranging bump electrode BP.

In the present embodiment, topmost conductive layer TCL for guard ring and topmost conductive layer TCL for pad are made of a material containing Al. This Al is less likely to oxidize than Cu. Therefore, by covering another portion of guard ring GR (multiple conductive layers CL) with topmost conductive layer TCL for guard ring containing this Al, the other portion (multiple conductive layers CL) can be restrained from oxidizing.

Second Embodiment

Figure 14:
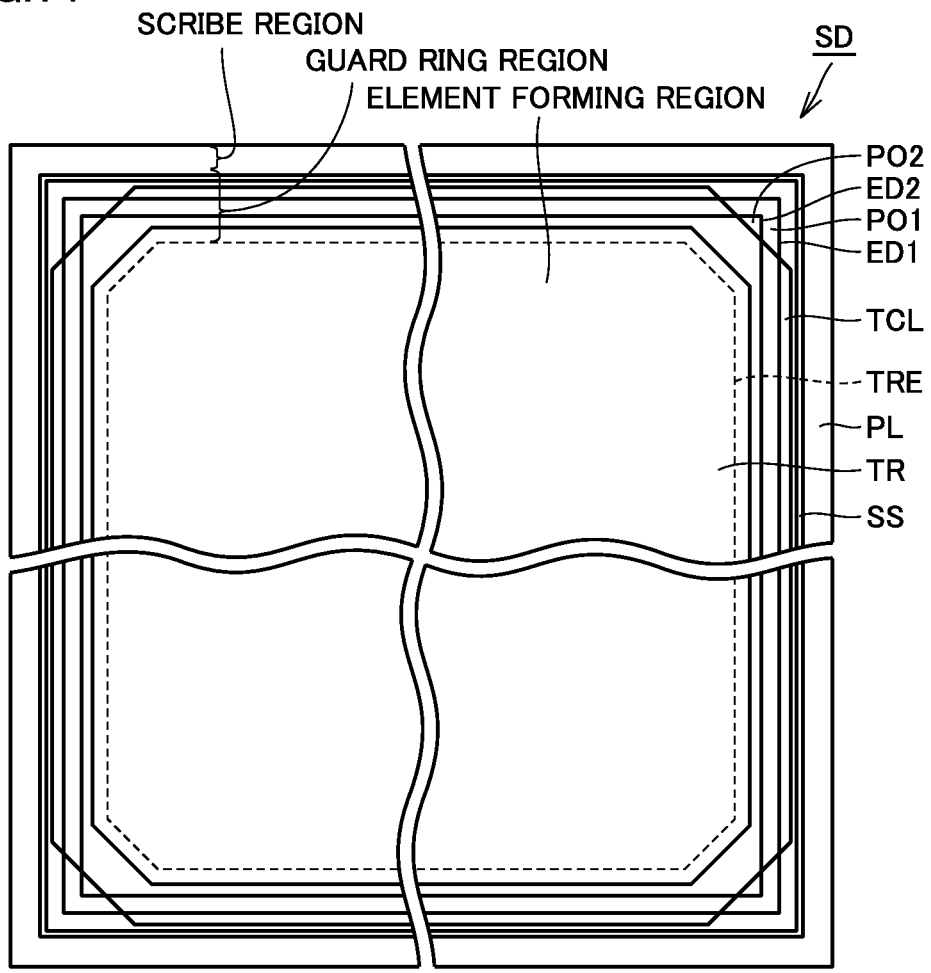
FIG. 14 is a plan view schematically showing a structure of a semiconductor device in the chip state according to a second embodiment.
Figure 15:
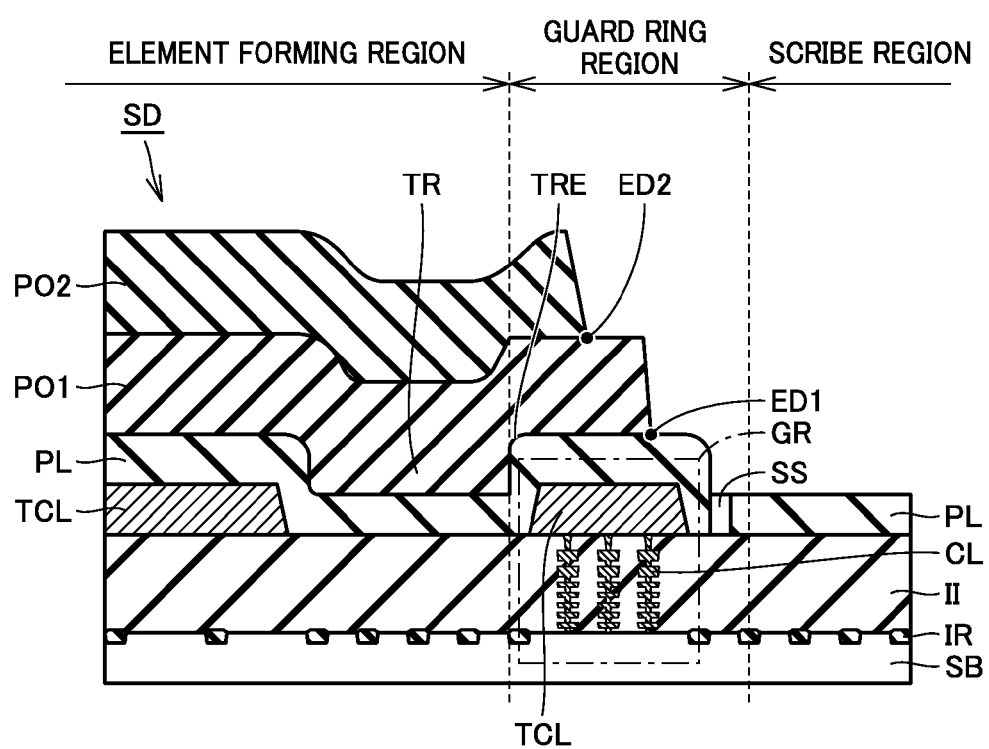
FIG. 15 is an enlarged partial cross sectional view schematically showing the outer circumferential edge of the semiconductor device in the chip state shown in FIG. 14 and its neighborhood.

Referring to FIGS. 14 and 15, as compared with the structure of the first embodiment, the structure of the present embodiment is different in that outer circumferential edge ED2 of second photosensitive organic insulating film PO2 is positioned, along its entire circumference, on the inner circumferential side with respect to outer circumferential edge ED1 of first photosensitive organic insulating film PO1. Therefore, outer circumferential edge ED2 of second photosensitive organic insulating film PO2 is positioned, along its entire circumference, over first photosensitive organic insulating film PO1. It is noted that outer circumferential edge ED1 of first photosensitive organic insulating film PO1 and outer circumferential edge ED2 of second photosensitive organic insulating film PO2 are both positioned directly over topmost conductive layer TCL for guard ring.

It is noted that since the remaining structure of FIG. 11 is substantially the same as the structure of the present embodiment, the same elements are denoted by the same reference characters, and description thereof will not be repeated.

A method for manufacturing the semiconductor device of the present embodiment undergoes steps similar to the steps of the first embodiment shown in FIGS. 6 to 10. Thereafter, redistribution layer RIL and second photosensitive organic insulating film PO2 are formed similarly to the first embodiment. On this occasion, as shown in FIGS. 14 and 15, second photosensitive organic insulating film PO2 is formed such that outer circumferential edge ED2 of second photosensitive organic insulating film PO2 is located on the inner circumferential side with respect to outer circumferential edge ED1 of first photosensitive organic insulating film PO1.

It is noted that since steps after second photosensitive organic insulating film PO2 is formed are also substantially identical to those of the manufacturing method of the first embodiment, description thereof will not be repeated.

In the present embodiment, effects substantially identical to those of the first embodiment can also be obtained.

Third Embodiment

Figure 16:
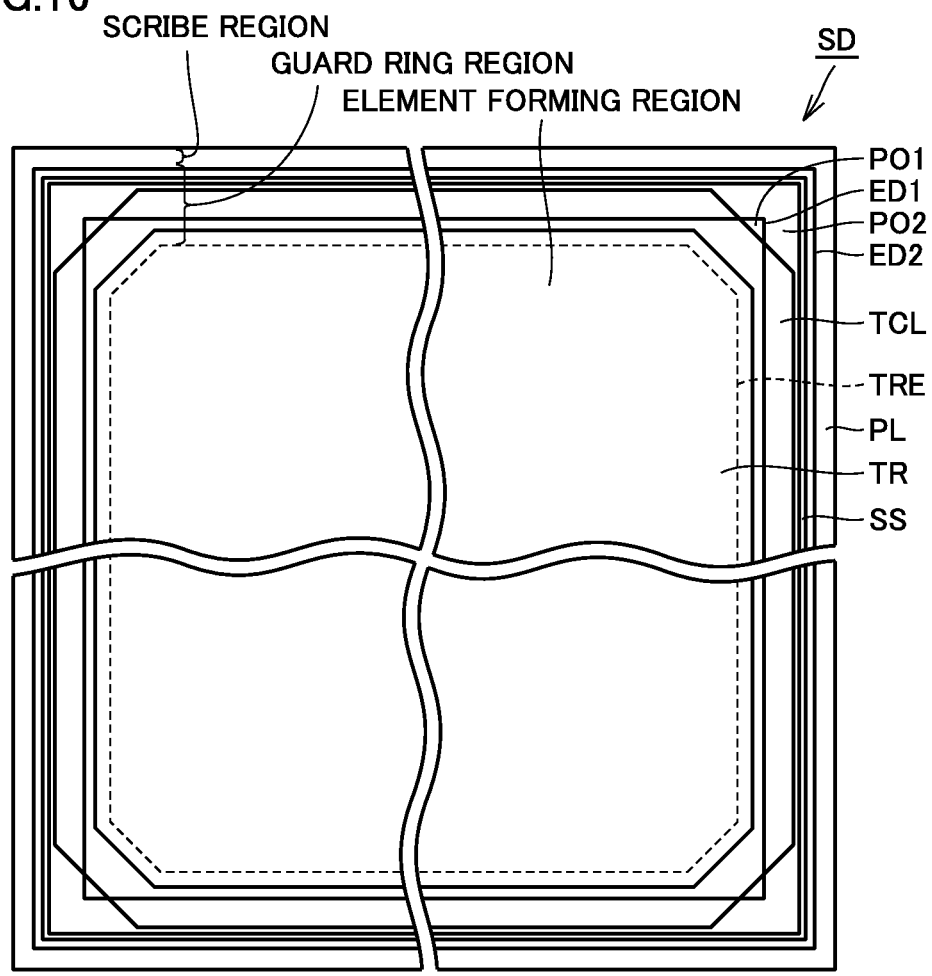
FIG. 16 is a plan view schematically showing a structure of a semiconductor device in the chip state according to a third embodiment.
Figure 17:
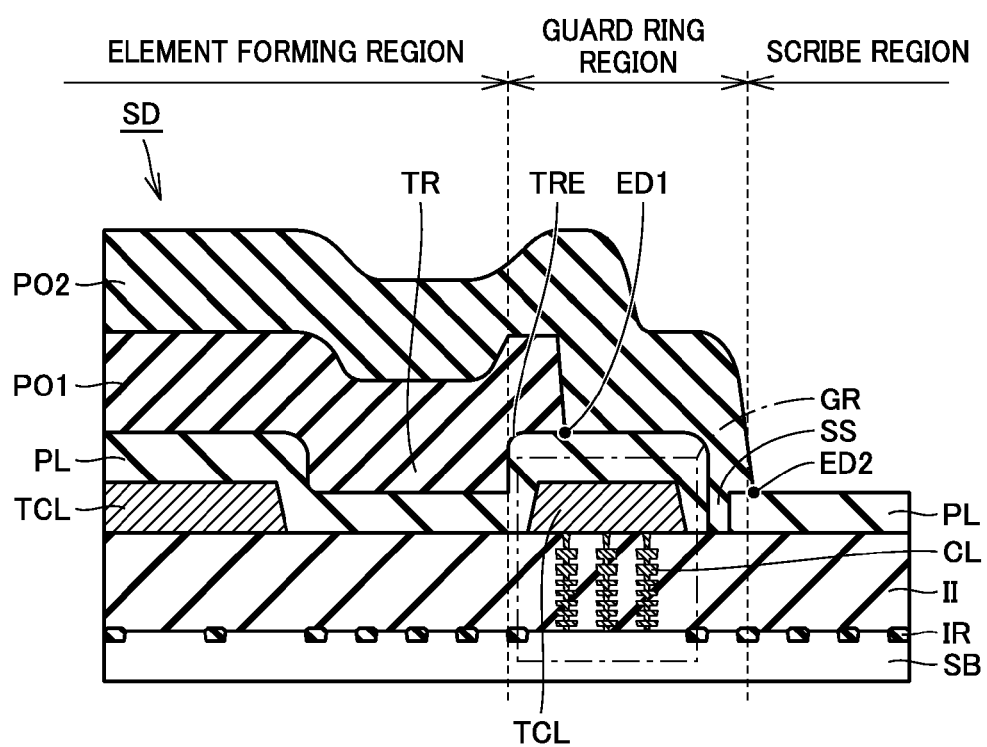
FIG. 17 is an enlarged partial cross sectional view schematically showing the outer circumferential edge of the semiconductor device in the chip state shown in FIG. 16 and its neighborhood.

Referring to FIGS. 16 and 17, as compared with the structure of the first embodiment, the structure of the present embodiment is different in that outer circumferential edge ED2 of second photosensitive organic insulating film PO2 is positioned, along its entire circumference, on the outer circumferential side with respect to silane slit SS. Therefore, second photosensitive organic insulating film PO2 fills silane slit SS along the entire circumference of silane slit SS.

It is noted that since the remaining structure of FIG. 11 is substantially the same as the structure of the present embodiment, the same elements are denoted by the same reference characters, and description thereof will not be repeated.

A method for manufacturing the semiconductor device of the present embodiment undergoes steps similar to the steps of the first embodiment shown in FIGS. 6 to 10. Thereafter, redistribution layer RIL and second photosensitive organic insulating film PO2 are formed similarly to the first embodiment. On this occasion, as shown in FIGS. 16 and 17, second photosensitive organic insulating film PO2 is formed such that outer circumferential edge ED2 of second photosensitive organic insulating film PO2 is located on the outer circumferential side with respect to silane slit SS.

It is noted that since steps after second photosensitive organic insulating film PO2 is formed are also substantially identical to those of the manufacturing method of the first embodiment, description thereof will not be repeated.

In the present embodiment, effects substantially identical to those of the first embodiment can also be obtained.

When developing second photosensitive organic insulating film PO2, the developing solution may remain in silane slit SS. In the present embodiment, however, second photosensitive organic insulating film PO2 fills that silane slit SS. This can prevent the developing solution when developing second photosensitive organic insulating film PO2 from remaining in silane slit SS. Therefore, reduction in adhesion between second photosensitive organic insulating film PO2 and passivation film PL due to the developing solution remaining in silane slit SS can be prevented.

Fourth Embodiment

Figure 18:
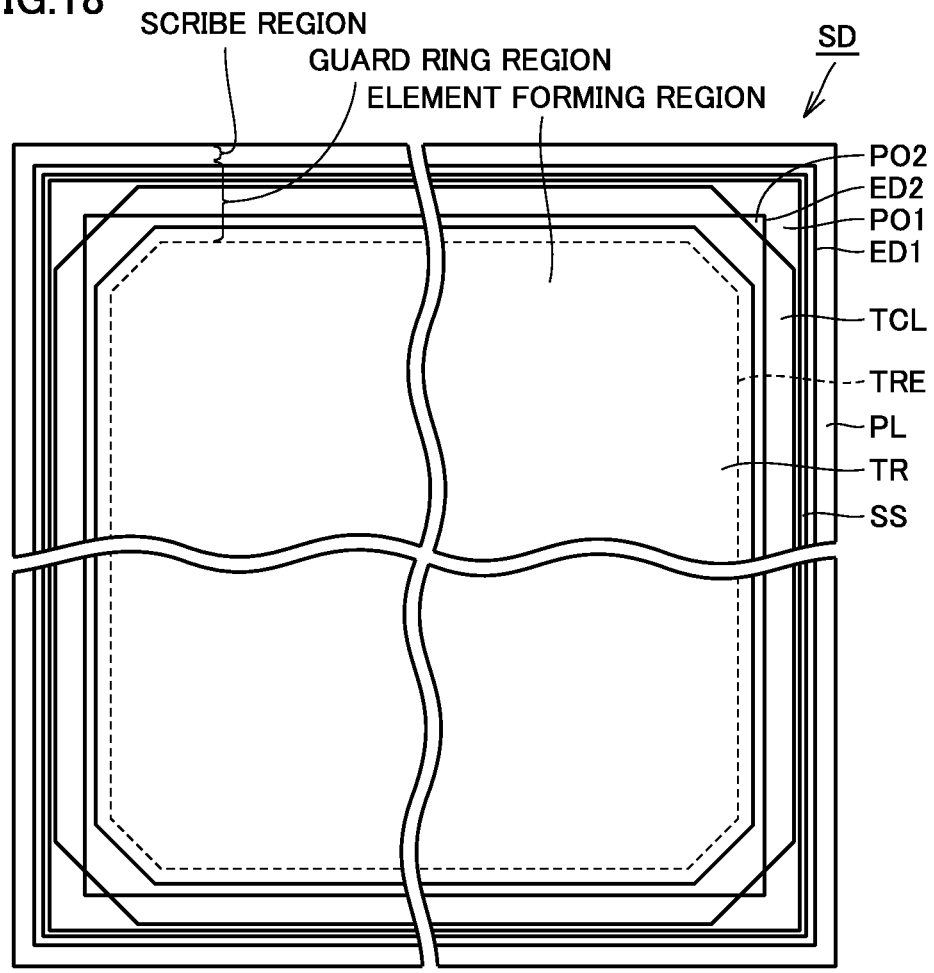
FIG. 18 is a plan view schematically showing a structure of a semiconductor device in the chip state according to a fourth embodiment.
Figure 19:
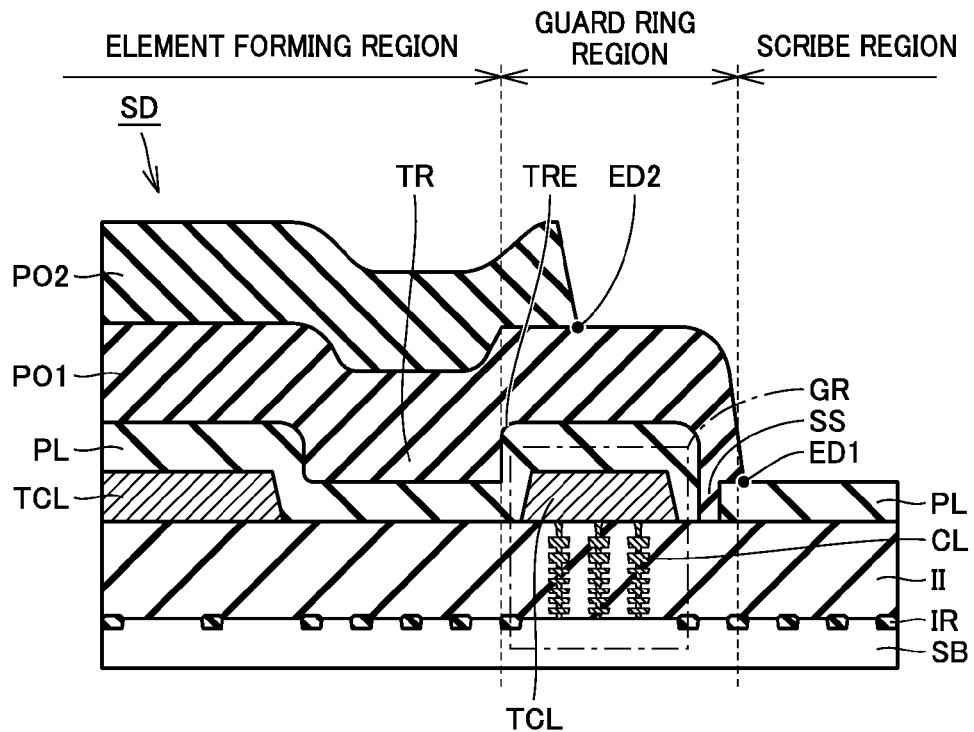
FIG. 19 is an enlarged partial cross sectional view schematically showing the outer circumferential edge of the semiconductor device in the chip state shown in FIG. 18 and its neighborhood.

Referring to FIGS. 18 and 19, as compared with the structure of the first embodiment, the structure of the present embodiment is different in that outer circumferential edge ED1 of first photosensitive organic insulating film PO1 is positioned, along its entire outer circumference, on the outer circumferential side with respect to circumferential edge ED2 of second photosensitive organic insulating film PO2, and positioned on the outer circumferential side with respect to silane slit SS. Therefore, first photosensitive organic insulating film PO1 fills silane slit SS along the entire circumference of silane slit SS.

It is noted that since the remaining structure of FIG. 11 is substantially the same as the structure of the present embodiment, the same elements are denoted by the same reference characters, and description thereof will not be repeated.

Figure 20:
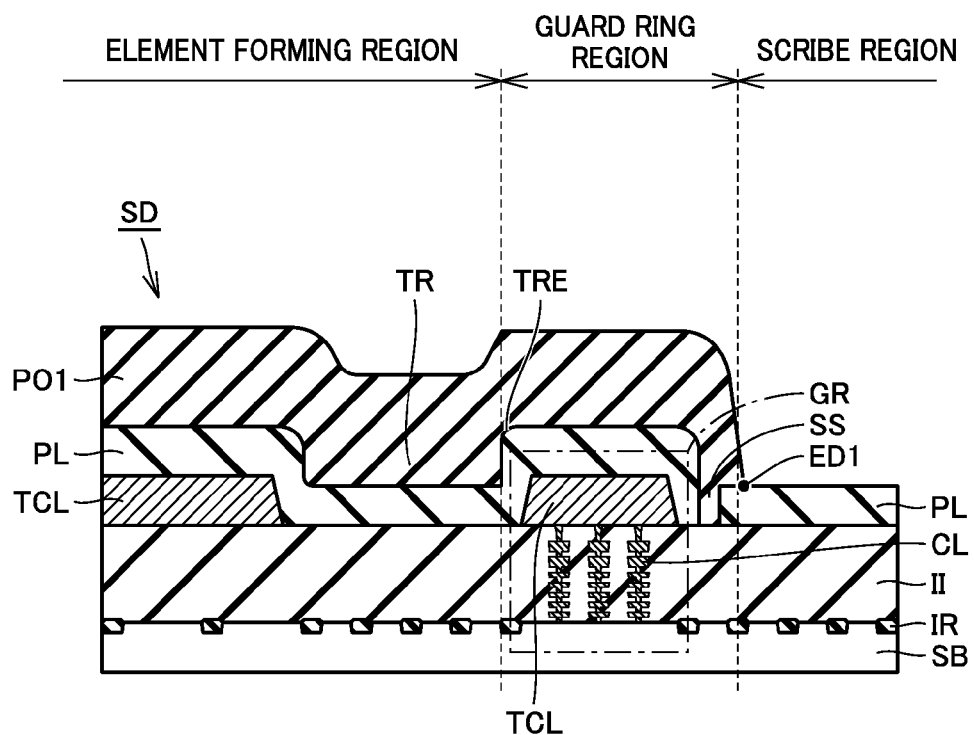
FIG. 20 is a schematic cross sectional view showing a method for manufacturing the semiconductor device according to the fourth embodiment in correspondence with the cross section shown in FIG. 5.

A method for manufacturing the semiconductor device of the present embodiment undergoes steps similar to the steps of the first embodiment shown in FIGS. 6 to 10. Thereafter, referring to FIG. 20, first photosensitive organic insulating film PO1 is formed, along its entire circumference, to have outer circumferential edge ED1 positioned on the outer circumferential side with respect to silane slit SS. An opening (not shown) reaching the surface of topmost conductive layer TCL for pad is formed in first photosensitive organic insulating film PO1. Thereafter, second photosensitive organic insulating film PO2, redistribution layer RIL and second photosensitive organic insulating film PO2 are formed similarly to the first embodiment.

It is noted that since steps after second photosensitive organic insulating film PO2 is formed are also substantially identical to those of the manufacturing method of the first embodiment, description thereof will not be repeated.

In the present embodiment, effects substantially identical to those of the first embodiment can also be obtained.

When developing each of first photosensitive organic insulating film PO1 and second photosensitive organic insulating film PO2, the developing solution may remain in silane slit SS. In the present embodiment, however, first photosensitive organic insulating film PO1 fills that silane slit SS. This can prevent the developing solution when developing first photosensitive organic insulating film PO1 and second photosensitive organic insulating film PO2 from remaining in silane slit SS. Therefore, reduction in adhesion between first photosensitive organic insulating film PO1 and passivation film PL due to the developing solution remaining in silane slit SS can be prevented.

Others

Figure 21:
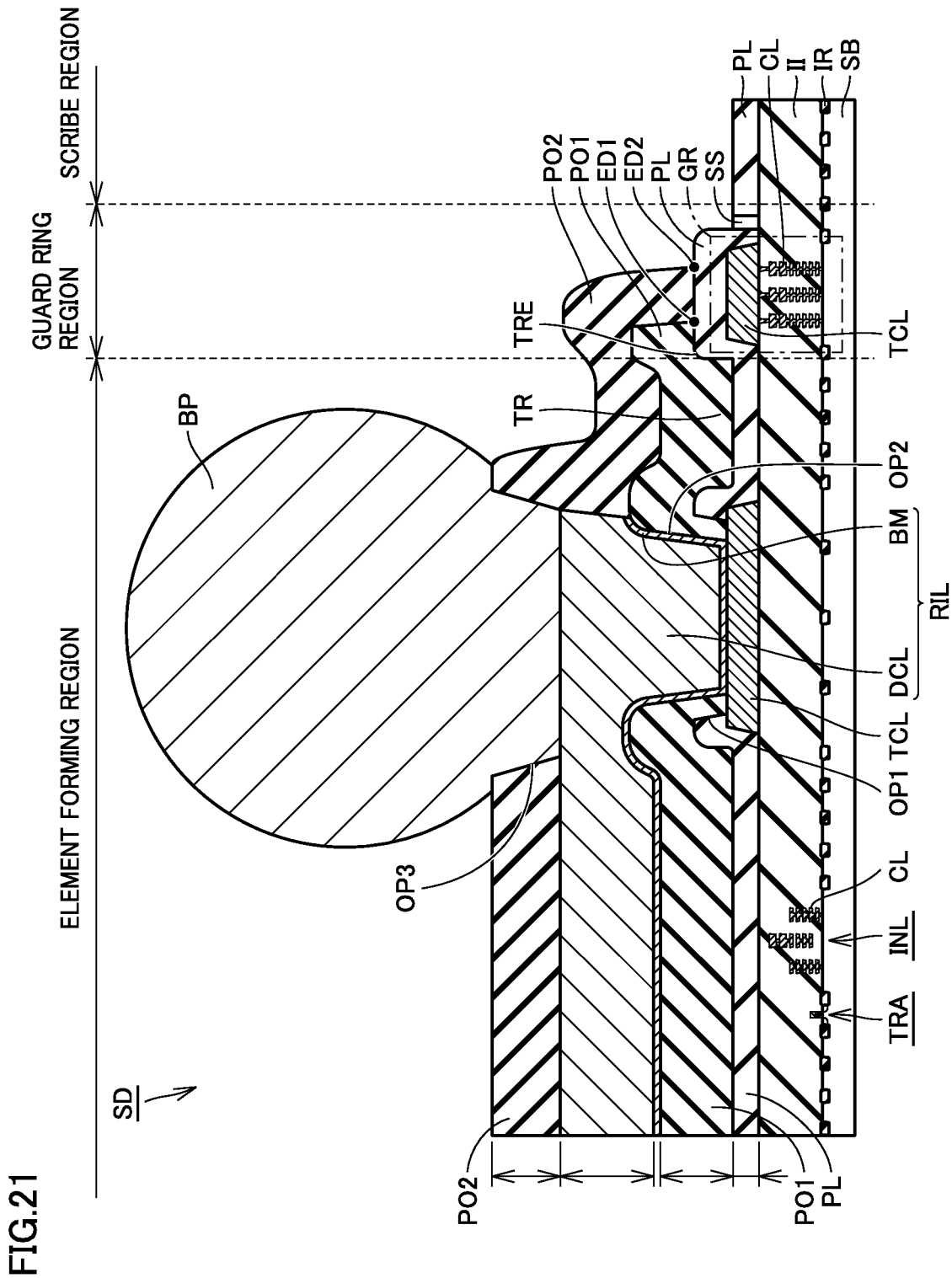
FIG. 21 is a cross-sectional view schematically showing a structure in which a bump electrode is positioned directly over a topmost conductive layer for pad.

In the above-described embodiments, the case where bump electrode BP is located in a region different from the region directly overlying the pad portion of topmost conductive layer TCL for pad has been described, however, bump electrode BP may be located in the region directly overlying the pad portion of topmost conductive layer TCL for pad as shown in FIG. 21.

In the above-described embodiments, the case where trench TR has a width of 5 μm has also been described, however, effects similar to those described above can also be obtained in the case where the width of this trench TR is more than or equal to 0.5 μm and less than or equal to 50 μm. Particularly in the case where this trench TR has a width of more than or equal to 0.5 μm and less than or equal to 5 μm, the above-described effects can be obtained remarkably.

In the above-described embodiments, the case where topmost conductive layer TCL has a thickness of 1 μm has been described, however, similar effects can also be obtained in the case where topmost conductive layer TCL has a thickness of more than or equal to 0.5 μm and less than or equal to 5 μm. As the thickness of topmost conductive layer TCL increases, the effects of the above-described first to fourth embodiments will become more remarkable.

In the above-described embodiments, the case where passivation film PL is p-SiN having a thickness of 600 nm has been described, however, effects similar to those of the above-described first to fourth embodiments are also obtained in the case where passivation film PL has a thickness of more than or equal to 60 nm and less than or equal to 6 μm.

In the above-described embodiments, the case where the side wall shape of first and second photosensitive organic insulating films PO1 and PO2 is a descending tapered shape (a shape increasing in width from the upper end to the lower end) has been described, however, similar effects can also be obtained when the side wall shape of first and second photosensitive organic insulating films PO1 and PO2 is a reverse tapered shape (a shape increasing in width from the lower end to the upper end). The above-described effects can also be obtained similarly, whether first and second photosensitive organic insulating films PO1 and PO2 are of negative type or positive type. Peeling is more likely to occur when the side wall shape of first and second photosensitive organic insulating films PO1 and PO2 is the reverse tapered shape, and therefore, effects of the above-described first to fourth embodiments are exhibited remarkably.

In the above-described embodiment, it is important that outer circumferential edge ED1 of first photosensitive organic insulating film PO1 is positioned on the outer circumferential side with respect to stepped portion TRE when developing first photosensitive organic insulating film PO1. That is, if outer circumferential edge ED1 of first photosensitive organic insulating film PO1 is positioned on the outer circumferential side with respect to stepped portion TRE at the time of development, the developing solution is prevented from remaining in between outer circumferential edge ED1 of first photosensitive organic insulating film PO1 and stepped portion TRE. Therefore, even if first photosensitive organic insulating film PO1 shrinks by heat treatment after the development (baking and curing), effects of the above-described first to fourth embodiments are obtained.

In the above-described embodiments, a 90-nm logic product has been described. In products prior to 130-nm node, products after 65-nm node, as well as products after 55-nm node, 45-nm node, 40-nm node, 28-nm node, and 22-nm node, however, there is a height difference made by topmost conductive layer TCL for guard ring, so that effects similar to those described above are obtained in the case of applying, exposing and developing first photosensitive organic insulating film PO1.

Even in a product of SRAM (Static Random Access Memory), DRAM (Dynamic Random Access Memory) or flash memory, or a product of a device having them mounted thereon in combination, there is a height difference made by topmost conductive layer TCL for guard ring, so that effects similar to those described above are obtained in the case of applying, exposing and developing first photosensitive organic insulating film PO1.

Although the invention yielded by the inventor of the present application has been described specifically based on the embodiment, the present invention is not limited to the above-described embodiments, but can be modified variously within the scope not departing from the spirit of the invention.

REFERENCE SIGNS LIST

BM barrier metal layer; BP bump electrode; CH chip region; CL, DCL conductive layer; ED1, ED2 outer circumferential edge; GR guard ring; II interlayer insulating layer;

IR element isolation structure; OP1, OP2, OP3 opening; PL passivation film; PO1 first photosensitive organic insulating film; PO2 second photosensitive organic insulating film; RIL redistribution layer; SB semiconductor substrate; SD semiconductor device in a chip state; WF semiconductor device in a wafer state; SS silane slit; TCL topmost conductive layer; TR trench; TRA transistor; TRE stepped portion.

The invention claimed is:

1. A semiconductor device having an element forming region and a guard ring region surrounding said element forming region in a plan view, comprising:
   a guard ring (GR) including at the top thereof a topmost conductive layer (TCL) for guard ring formed in said guard ring region to surround the circumference of said element forming region in said plan view;
   a passivation film (PL) formed in said guard ring region and said element forming region to cover said topmost conductive layer (TCL) for guard ring; and
   a first photosensitive organic insulating film (PO1) formed in contact with said passivation film (PL),
   at a surface of said passivation film (PL), a stepped portion (TRE) being formed on an inner circumferential side to be the side of said element forming region with respect to said topmost conductive layer (TCL) for guard ring, and because of said stepped portion (TRE), said surface of said passivation film (PL) on the inner circumferential side with respect to said topmost conductive layer (TCL) for guard ring being lower than said surface of said passivation film (PL) directly over said topmost conductive layer (TCL) for guard ring,
   said first photosensitive organic insulating film (PO1) covering the entire circumference of said stepped portion (TRE) in a plan view and having an outer circumferential edge (ED1) positioned, along the entire circumference, on the outer circumferential side with respect to said stepped portion (TRE).

2. The semiconductor device according to claim 1, further comprising a second photosensitive organic insulating film (PO2) formed on said first photosensitive organic insulating film (PO1).

3. The semiconductor device according to claim 2, wherein said second photosensitive organic insulating film (PO2) covers said outer circumferential edge (ED1) of said first photosensitive organic insulating film (PO1), and an outer circumferential edge (ED2) of said second photosensitive organic insulating film (PO2) is positioned on the outer circumferential side with respect to said outer circumferential edge (ED1) of said first photosensitive organic insulating film (PO1).

4. The semiconductor device according to claim 3, wherein
   a trench (SS) extending through said passivation film (PL) is formed to surround the outer circumference of said guard ring region in a plan view, and
   said second photosensitive organic insulating film (PO2) fills said trench (SS).

5. The semiconductor device according to claim 2, wherein outer circumferential edge (ED2) of said second photosensitive organic insulating film (PO2) is positioned on the inner circumferential side with respect to said outer circumferential edge (ED1) of said first photosensitive organic insulating film (PO1).

6. The semiconductor device according to claim 3, wherein
   a trench (SS) extending through said passivation film (PL) is formed to surround the outer circumference of said guard ring region in a plan view, and
   said first photosensitive organic insulating film (PO1) fills said trench (SS).

7. The semiconductor device according to claim 1, further comprising:
   a topmost conductive layer (TCL) for pad formed from a same layer as said topmost conductive layer (TCL) for guard ring to be isolated from said topmost conductive layer (TCL) for guard ring; and
   a bump electrode (BP) formed directly over a pad portion of said topmost conductive layer (TCL) for pad to be electrically connected to said topmost conductive layer (TCL) for pad.

8. The semiconductor device according to claim 1, further comprising:
   a topmost conductive layer (TCL) for pad formed from a same layer as said topmost conductive layer (TCL) for guard ring to be isolated from said topmost conductive layer (TCL) for guard ring;
   a redistribution layer (RIL) formed to be connected to a pad portion of said topmost conductive layer (TCL) for pad on said topmost conductive layer (TCL) for pad and to extend from a directly overlying region of said pad portion of said topmost conductive layer (TCL) for pad to an other region different from said directly overlying region; and
   a bump electrode (BP) formed on said redistribution layer (RIL) and connected to said redistribution layer (RIL), wherein
   said bump electrode (BP) is positioned directly over said other region.

9. The semiconductor device according to claim 1, wherein said topmost conductive layer (TCL) for guard ring is made of a material containing aluminum.

10. The semiconductor device according to claim 1, wherein said semiconductor device (SD) is in a chip state.

11. The semiconductor device according to claim 1, wherein said semiconductor device (WF) is in a wafer state.

* * * * *